United States Patent
Carley

(10) Patent No.: US 7,221,295 B2
(45) Date of Patent: May 22, 2007

(54) HIGH SPEED SERIALIZER-DESERIALIZER

(75) Inventor: Adam L. Carley, Windham, NH (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/052,926

(22) Filed: Feb. 9, 2005

(65) Prior Publication Data

US 2005/0174271 A1  Aug. 11, 2005

Related U.S. Application Data

(60) Provisional application No. 60/543,041, filed on Feb. 9, 2004.

(51) Int. Cl.
*H03M 7/00* (2006.01)

(52) U.S. Cl. .................... 341/101; 341/59; 341/100

(58) Field of Classification Search .............. 341/58, 341/59, 67, 65, 50, 101, 100; 375/237, 253, 375/239, 238, 243
See application file for complete search history.

(56) References Cited

U.S. PATENT DOCUMENTS

| | | | | |
|---|---|---|---|---|
| 4,330,856 A | * | 5/1982 | Takasaki et al. | ............ 370/506 |
| 4,369,472 A | * | 1/1983 | Tanaka et al. | ............ 360/40 |
| 4,373,154 A | * | 2/1983 | Balme et al. | ............ 341/58 |
| 4,752,841 A | * | 6/1988 | Syracuse et al. | ............ 360/49 |
| 4,864,303 A | | 9/1989 | Ofek | |
| 5,315,299 A | * | 5/1994 | Matsumoto | ............ 341/53 |
| 5,387,906 A | * | 2/1995 | Lee | ............ 340/825.64 |
| 5,519,683 A | * | 5/1996 | Mizokami et al. | ............ 369/59.19 |
| 5,640,160 A | * | 6/1997 | Miwa | ............ 341/53 |
| 5,864,877 A | | 1/1999 | Henry et al. | |
| 5,912,898 A | | 6/1999 | Khoury | |
| 5,978,720 A | * | 11/1999 | Hieronymus et al. | ............ 701/29 |
| 6,047,032 A | | 4/2000 | Zortea et al. | |
| 6,114,840 A | | 9/2000 | Farrell et al. | |
| 6,181,499 B1 | * | 1/2001 | Hutchins et al. | ............ 360/53 |
| 6,377,094 B1 | | 4/2002 | Carley | |
| 6,664,832 B2 | | 12/2003 | Carley | |
| 6,664,838 B1 | | 12/2003 | Talledo | |
| 6,710,726 B2 | | 3/2004 | Kim et al. | |
| 2004/0264612 A1 | | 12/2004 | Allen | |

\* cited by examiner

*Primary Examiner*—Peguy JeanPierre
(74) *Attorney, Agent, or Firm*—Edell, Shapiro & Finnan, LLC

(57) ABSTRACT

A high speed serializer-deserializer (SerDes) that passes significantly more data through a channel for a given analog bandwidth and signal-to-noise ratio. This SerDes technique involves converting a plurality of bits to be transferred to positions of edges of a waveform that is transmitted over at least one transmission wire from a source to a destination. The plurality of bits are converted to edges in order to position edges such that more than k inter-edge spacings are possible over a range of spacings between T and kT, where k is a real number greater than 1 and T is the minimum spacing between consecutive edges. An edge position translation scheme that maps patterns in a stream of input bits to a corresponding spacing between a rising edge and a falling edge of the waveform, or between a falling edge and a rising edge of the waveform. The bits are recovered at the destination by detecting the edges in the received waveform at the destination and driving a stream of binary numbers representing time intervals between detected consecutive edges (inter-edge spacings). The stream of binary numbers is decoded according to the edge position translation scheme to recover corresponding bits.

88 Claims, 5 Drawing Sheets

HIGH SPEED SERIALIZER-DESERIALIZER

This application claims priority to U.S. Provisional Application No. 60/543,041, filed Feb. 9, 2004, the entirety of which is incorporated herein by reference.

BACKGROUND OF THE INVENTION

Serial transfer of digital data has a long history but recently the interest in improving this technology has heightened. As data words and data busses grow wider and processing cheaper, it becomes increasingly desirable, indeed vital, to move digital data in serial form from one system to another, from one board to another within a system, from one chip to another on a board, and even from one core to another within a chip. In current Serializer-Deserializer (SerDes) transmitter practice, the parallel source data is loaded into a shift register and shifted out at high speed. At the receiver the reverse process takes place: data is shifted at high speed into a shift register and offloaded in parallel. This seemingly simple process has evolved into elaborate systems as more and more data are packed onto a wire.

Differential signaling is used to reduce noise and increasingly elaborate "analog front ends" (AFEs) are used to control noise and reflections on the transmission lines. Special dielectrics are used to reduce high-frequency losses. Clock phase and jitter are critical and feedback circuits are used to exactly "recover" and phase-align the desired clock. Error-correcting codes are required to achieve acceptable Bit Error Rates (BER) and these codes extract an overhead in reduced data throughput. An additional layer of coding, such as the so-called "8B/10B" code, is modulated onto the data stream to prevent excessive stretches without a transition (which would interfere with clock recovery) and to guarantee equal numbers of zeros and ones within a given interval (which removes low frequencies, improves noise immunity, and simplifies analog design). The latter codes also reduce data throughput. 8B/10B, for instance, encodes eight bits into ten bits and therefore reduces throughput 20%. On top of this, spread-spectrum clocking is used to reduce electromagnetic interference (EMI).

Current SerDes practice, for all its complications, is still basically a serial bit stream. As shown in FIGS. 1 and 2, a zero or one lasts one clock period (T) and is followed by a zero or one in the next clock period. If there is no transition between bits on a given clock, the waveform must wait for the next clock before there can be a transition for transmission.

SUMMARY OF THE INVENTION

Briefly, a high speed serializer-deserializer (SerDes) is provided that passes significantly more data through a channel for a given analog bandwidth and signal-to-noise ratio. Conversely, the SerDes techniques described herein may transfer the same amount of data as conventional SerDes techniques, but at lower analog frequencies avoiding the aforementioned problems and using less expensive implementations.

This SerDes technique involves converting a plurality of bits to be transferred to positions of edges of a waveform that is transmitted over at least one transmission wire from a source to a destination. The plurality of bits are converted to edges in order to position edges such that more than k inter-edge spacings are possible over a range of spacings between T and kT, where k is a real number greater than 1 and T is the minimum spacing between consecutive edges. An edge position translation scheme is provided that maps patterns in a stream of input bits to corresponding spacings between consecutive edges of the waveform. The bits are recovered at the destination by detecting the edges in the received waveform at the destination and deriving a stream of binary numbers representing time intervals between detected consecutive edges (inter-edge spacings). The stream of binary numbers is determined according to the edge position translation scheme to recover corresponding bits.

Adding this new degree of freedom increases the information throughput without increasing the analog signal processing burden. Transitions need not be sharper, frequencies need not be higher, and the analog front end circuitry need not be faster. Indeed, there is less low frequency energy in the signal so that frequency dispersion in the transmission medium is less disruptive. Also, the clock frequency and its sub harmonics are essentially absent from the waveform, making the signal intrinsically spread-spectrum. Therefore, no special spread-spectrum circuitry is required.

The above and other objects and advantages will become more readily apparent when reference is made to the following description taken in conjunction with the accompanying drawings.

DETAILED DESCRIPTION

Underlying Theory

Assume each transition or edge in a binary (meaning bi-valued) waveform is followed by another of the opposite polarity that is later in time by:

$$\Delta t = T(1+n\delta) \quad (1)$$

where: T is the minimum allowed spacing between edges that may occur at multiple intermediary positions between T and kT, where k is a real number greater than 1, $\delta$ is the granularity of edges for the enhanced SerDes techniques described herein, and n is an edge index and is an integer from 0 to some maximum. In some applications, it may be desired to make k an integer greater than or equal to 2 for design simplification, but it is not a requirement. That is, the largest inter-edge spacing need not be a multiple of the smallest inter-edge spacing. When $\delta=1$, conventional SerDes is practiced.

If the probability of each possible edge or transition n is selected so that Shannon information per unit time is equal among all n, then the data rate of the channel, R (in bits per T) of the enhanced SerDes technique, in the absence of noise, is given by:

$$\log_2[1-2^{-R\delta}] = -R \quad (2)$$

The data rate R satisfying this equation is approximately the Shannon information limit for the channel. But the true Shannon limit can only be higher, not lower, which would increase the usefulness of the technique.

Numerically solving equation (2) for selected values of $\delta$ produces the following values for R:

TABLE 1

| $\delta$ | R | |
|---|---|---|
| 1.000 | 1.00 | (conventional SerDes) |
| 0.500 | 1.39 | |
| 0.333 | 1.65 | |
| 0.250 | 1.86 | |
| 0.200 | 2.02 | |
| 0.125 | 2.39 | |
| 0.100 | 2.60 | |

When time is subdivided to a granularity of one-fifth T, that is when $\delta$ is 0.200, the data rate R doubles, as compared with conventional SerDes. Although the $\delta$ values in the table above happen to all be reciprocal integers, it is not a requirement. The coding scheme may designed such that the smallest and largest possible spacing between consecutive edges each regularly occurs in the waveform.

Figure 1:
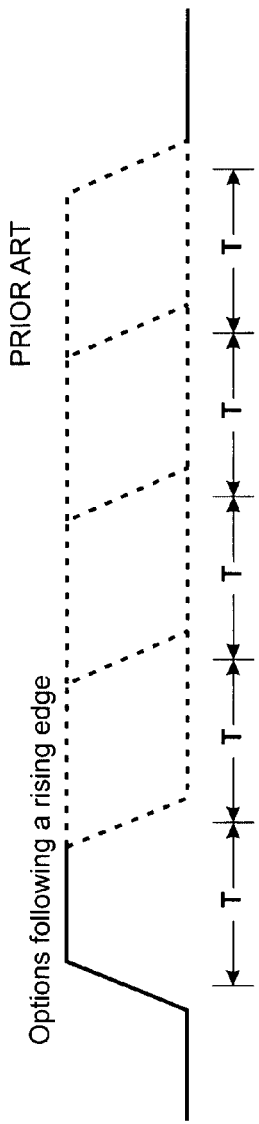
FIGS. 1 and 2 show timing diagrams that illustrate the drawbacks of prior art SerDes techniques.
Figure 2:
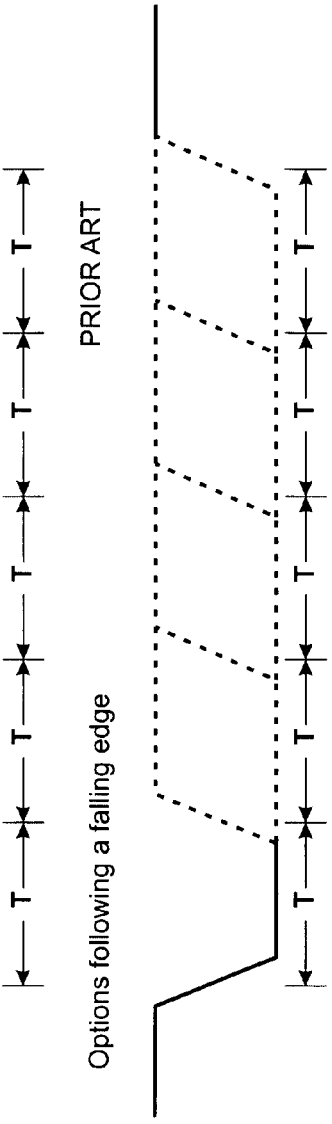
Figure 3:
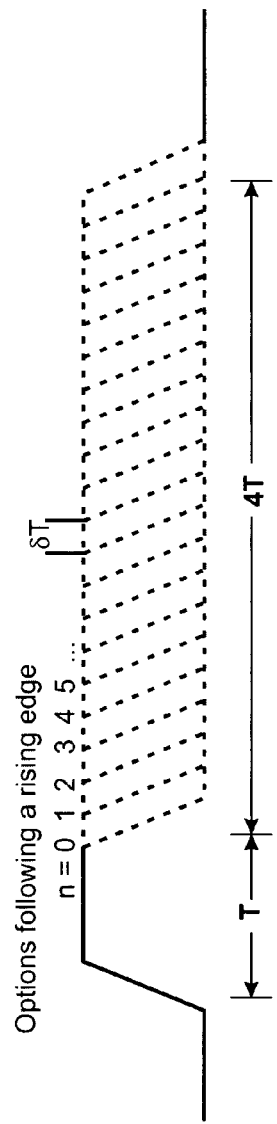
FIGS. 3 and 4 show timing diagrams that illustrate the advantages of the SerDes techniques described herein.
Figure 4:
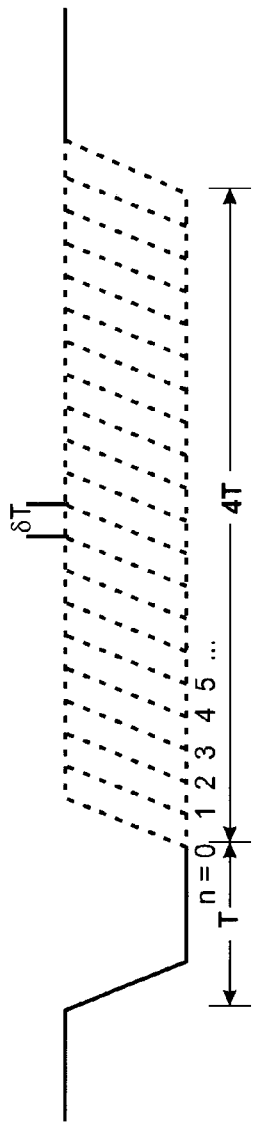

FIGS. 3 and 4 show an exemplary timing diagram where the enhanced SerDes techniques are applied to a rising edge and a falling edge. After an initial interval T, the time interval between consecutive possible edges is $\delta T$. These figures also show that the value of n identifies and corresponds to which of the possible edges is selected after the initial interval T. The edge position translation scheme in Table 2 maps patterns in a stream of processed bits to a corresponding spacing between a rising edge and a falling edge of the waveform, or between a falling edge and a rising edge of the waveform. Thus, serializing a plurality of bits involves converting the bits to corresponding edge positions using a coding scheme that maps bit patterns to inter-edge spacings of a waveform. Similarly, deserializing the waveform involves detecting edges in the waveform to derive the time intervals between edges (inter-edge spacings) of the received waveform, and decoding the time between edges to obtain a corresponding bit pattern according to the edge position translation scheme.

Said more generally, the coding scheme involves converting the plurality of bits to a plurality of edges of a waveform in order to position edges such that more than k inter-edge spacings are possible over a range of spacings between T and kT, where k is real number greater than 1 and T is the minimum spacing between consecutive edges.

Figure 5:
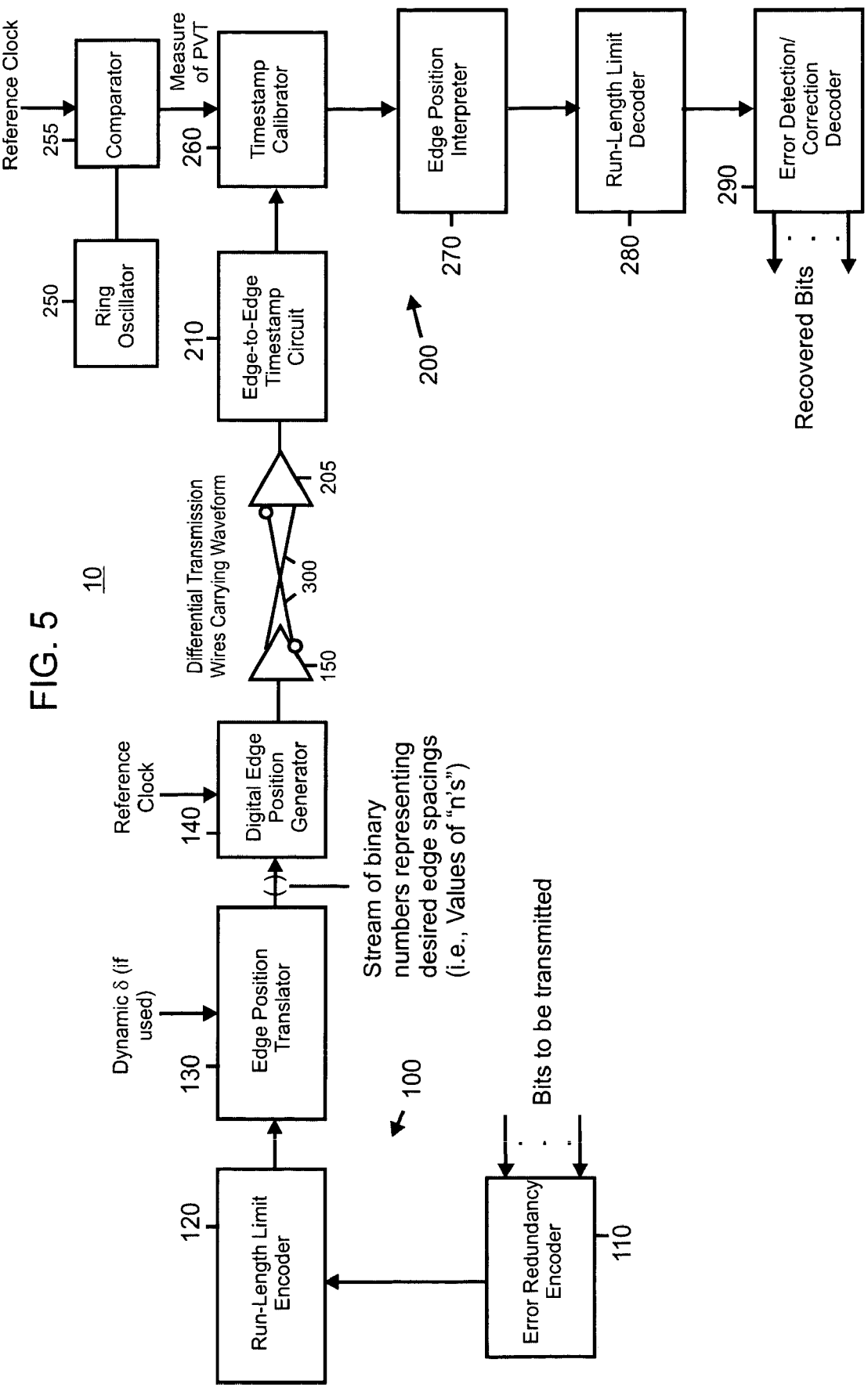
FIG. 5 is a block diagram of a SerDes system and illustrates the major components for practicing the SerDes methods shown in FIGS. 3 and 4.

Turning to FIG. 5, a system block diagram is shown, depicting the computation blocks useful to perform the enhanced SerDes techniques. The enhanced SerDes system 10 comprises a transmitter (serializer) 100 and a receiver (deserializer) 200. The transmitter 100 sends a waveform over differential transmission wires 300. The transmitter 100 receives parallel bits as input data and converts these bits to a waveform representing the bits that is passed over the differential transmission wires 300 to the receiver 200. The receiver 200 converts the received waveform to the parallel bits corresponding to the input data at the transmitter 100.

The transmitter 100 comprises an error redundancy encoder 110, a run-length limit encoder 120, an edge position translator 130, a digital edge generator 140 and an analog driver 150. The error redundancy encoder 110 takes the parallel input bits and inserts additional error detection/correction code bits using any of a variety of known error detection/correction coding techniques. For example, error redundancy encoder 110 may use checksum or parity coding techniques. The output of the error redundancy encoder 110 is a block of bits representing the output of the error redundancy encoding process on the input bits. The run-length limit (RLL) encoder 120 operates on the encoded bits output by the error redundancy encoder 110. As is known in the art, the parameter that defines RLL encoding is the maximum run-length, where the term "run" refers to a consecutive sequence of the same bit in a data stream. The run-length limit determines the maximum allowed spacing between edges. The output of the RLL encoder 120 is a run-length limit encoded bit stream (or as known in the art, a stream made up of multiple packets), also referred to as RLL-encoded bits.

The edge position translator 130 imposes a further level of encoding on the output of the RLL encoder 120, which converts the RLL-encoded bits to edge spacings, i.e., the n values in equation (1). That is, the edge position translator 130 maps patterns in the RLL-encoded bits to time intervals between consecutive edges (inter-edge spacings), also called edge positions, in the form of binary numbers for n. The edge position translator 130 produces a stream of binary numbers representing n values based on the processed (error encoded and RLL-encoded) input bits.

The data-rate equation (2) assumes the probability of a given edge position may be arbitrarily selected between 0.0 and 1.0. Converting from a real data source with equal 0's and 1's to achieve such arbitrary probability involves arbitrarily complex and latent computation. However, the edge position translator 130 may implement the code presented in Table 2 that closely approximates optimum performance.

TABLE 2

| Input Data | Time Interval Between a Rising Edge and Falling Edge | Input Data | Time Interval Between a Falling Edge and a Rising Edge |
|---|---|---|---|
| (1)10 | T | (0)01 | T |
| (1)00 | $T(1 + \delta)$ | (0)11 | $T(1 + \delta)$ |
| (1)110 | $T(1 + 2\delta)$ | (0)001 | $T(1 + 2\delta)$ |
| (1)010 | $T(1 + 3\delta)$ | (0)101 | $T(1 + 3\delta)$ |
| (1)1110 | $T(1 + 4\delta)$ | (0)0001 | $T(1 + 4\delta)$ |
| (1)0110 | $T(1 + 5\delta)$ | (0)1001 | $T(1 + 5\delta)$ |
| (1)11110 | $T(1 + 6\delta)$ | (0)00001 | $T(1 + 6\delta)$ |
| (1)01110 | $T(1 + 7\delta)$ | (0)10001 | $T(1 + 7\delta)$ |
| (1)111110 | $T(1 + 8\delta)$ | (0)000001 | $T(1 + 8\delta)$ |
| (1)011110 | $T(1 + 9\delta)$ | (0)100001 | $T(1 + 9\delta)$ |
| etc. | etc. | etc. | etc. |

In the Input Data columns, the bit in parentheses corresponds to the last bit of the Input Data in the other column. For example, when the input data is 0001, the corresponding time interval between a falling edge and the subsequent rising edge is $T(1+2\delta)$. The "1" bit in this pattern also corresponds to the leading 1, in parenthesis, in the column of input data on the left and the subsequent bits will determine the time interval from that rising edge to the subsequent falling edge. Similarly, the "0" in parenthesis in the input data column on the right corresponds to the right-most "0" for input data in the left-hand Input Data column. If the next group of bits following that "1" referred to in "0001" above were 11110, then the time interval between that falling edge and the subsequent rising edge is T(1+6δ). This coding process repeats, switching between the two columns of data to determine the time interval to the next edge.

Table 2 can be simplified to the following rules.

TABLE 2A

| Following a (1) | Value of n | Rising Edge to Falling Edge Spacing |
|---|---|---|
| 1 1$^m$ 0 | 2m | T(1 + 2mδ) |
| 0 1$^m$ 0 | 2m + 1 | T(1 + (2m + 1)δ) |

TABLE 2B

| Following a (0) | Value of n | Falling Edge to Rising Edge Spacing |
|---|---|---|
| 0 0$^m$ 1 | 2m | T(1 + 2mδ) |
| 1 0$^m$ 1 | 2m + 1 | T(1 + (2m + 1)δ) | where $1^m$ means m one's in a row, $0^m$ means m zero's in a row, and m is zero or any positive integer.

This edge position translation code communicates input data at an average rate given by:

$$R = 6/(2+5δ) \quad (3)$$

Sample solutions of equation (3) are:

TABLE 3

| δ | R |
|---|---|
| 1.000 | 0.86 |
| 0.500 | 1.33 |
| 0.333 | 1.64 |
| 0.250 | 1.85 |
| 0.200 | 2.00 |
| 0.125 | 2.29 |
| 0.100 | 2.40 |

Noteworthy is how closely this code tracks the theoretical limit in the mid-range values for δ. There are many variations of this code, for example switching falling and rising edges in Tables 2A and 2B such that the specified "rising edge to falling edge spacing" serves as the "falling edge to rising edge spacing" and the specified "falling edge to rising edge spacing" serves as the "rising edge to falling edge spacing". Alternatively, even and odd n entries in the Tables 2A and 2B may be switched. This is the same as complementing the first bit in the first column in one or both pairs of rows in Tables 2A and 2B.

The code in Table 2 allows arbitrarily long stretches between transitions, which is not acceptable for the reasons discussed above. Coding techniques similar to those used in conventional SerDes will limit run lengths. For example, if the input data to the above code is subjected to the well known '8B/10B' code, then one can see by inspection that long output stretches are avoided but the same 20% data rate penalty will be paid as in conventional SerDes techniques. That 20% penalty can be reduced, as compared with conventional SerDes techniques, by noting that high δ multiples does not mean very long time gaps (inter-edge spacings) if δ is much less than 1. Therefore, less costly codes than the '8B/10B' code may be used and still guarantee the worst-case time gap as in conventional SerDes.

Unlike conventional SerDes techniques, input data consumption is not strictly uniform with the enhanced SerDes techniques described herein. The transmitted data could get ahead of or behind the source data based on data content. This is correctable by input coding that limits accumulation of the discrepancy to some preset limit by way of the RLL encoding imposed by the RLL encoder 120. Thus, the RLL encoder 120 may use a run-length limiting code that also limits the degree to which transmitted data can get ahead of or behind the plurality of bits at the source. In implementation, a first-in-first-out (FIFO) buffer is provided on the transmit side and receive side to manage the build up of data. Nevertheless, this further feature of the RLL-encoder is useful to avoid exceeding the capacity of the FIFO buffer.

The output of the edge position translator 130 is a stream of binary numbers representing inter-edge spacings (values of n) of a waveform. The digital edge generator 140 takes the stream of binary numbers representing values of n output by the edge position translator 130 and positions rising or falling edges as given by equation (1) and shown in FIGS. 3 or 4. An example of a digital device suitable for the digital edge generator 140 is an arbitrary waveform synthesizer, an example of which is disclosed in commonly assigned U.S. Pat. Nos. 6,377,094 and 6,664,832, entitled "Arbitrary Waveform Synthesizer Using a Free-Running Oscillator," the entirety of each of which is incorporated herein by reference.

The digital edge generator 140 outputs a waveform having edges with the desired spacings to an analog driver 150, which in turn drives the bi-valued waveform on the differential transmission wires 300 to the receiver 200. The transmitted waveform is a binary (bi-valued) waveform, wherein each transition or edge is followed by another of the opposite polarity that is later in time, Δt, as described in equation (1).

The receiver 200 comprises an analog receiver 205 that receives the edges from the differential transmission wires 300, an edge-to-edge timestamp circuit 210, a timestamp calibrator circuit 260, an edge position interpreter 270, a run-length limit decoder 280 and an error detection/correction decoder 290.

The edge-to-edge timestamp circuit 210 is a circuit that determines the time intervals between consecutive edges of the waveform received by the analog receiver, relative to the process, voltage and temperature conditions of the integrated circuit on which the circuit 210 is implemented. The output of this circuit is a digital edge delta value that represents these time intervals.

Figure 6:
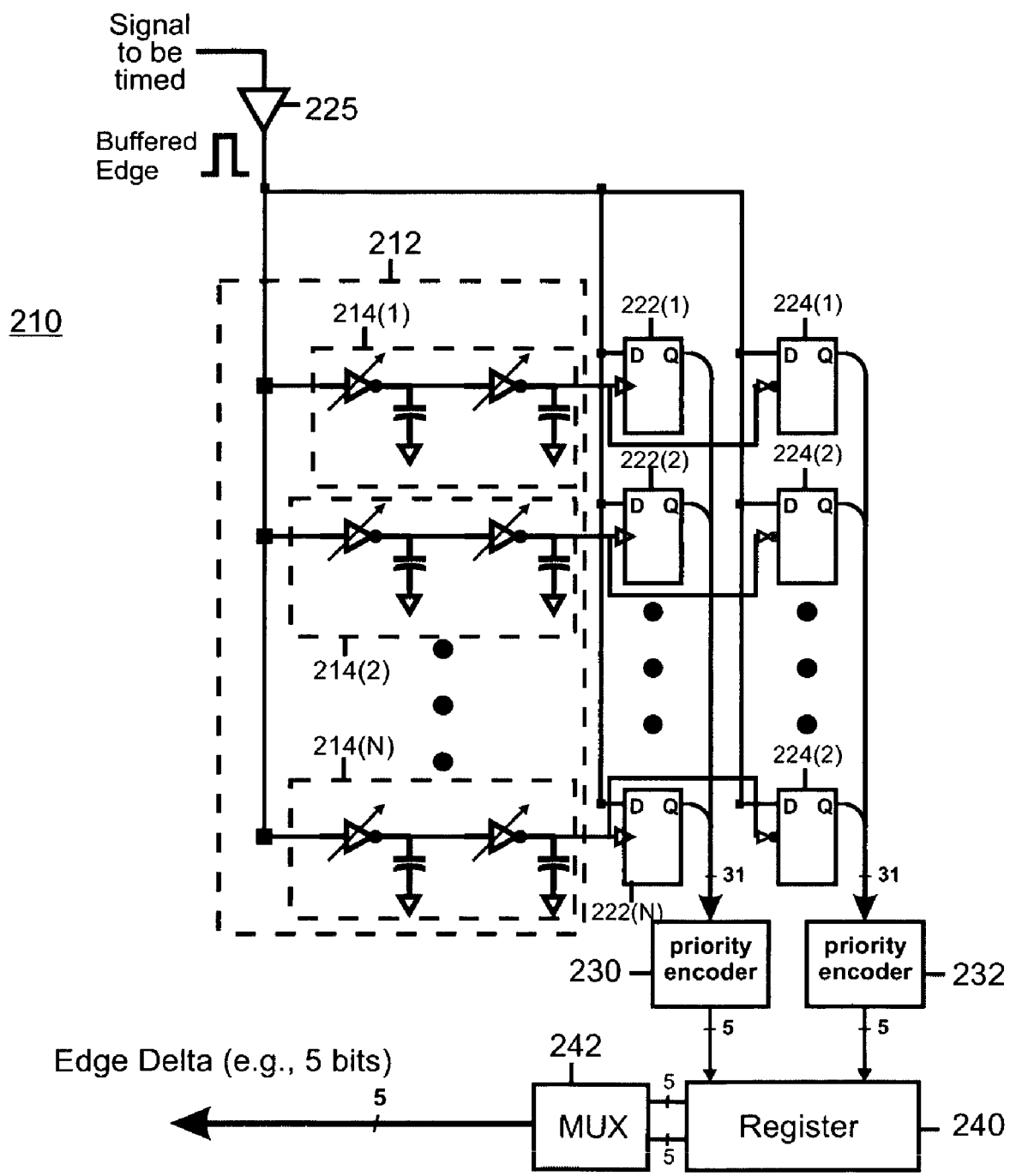
FIG. 6 is a schematic diagram showing one form of an edge-to-edge timestamp block in the receiver portion of the SerDes system shown in FIG. 5.

Turning to FIG. 6, an example of the edge-to-edge timestamp circuit 210 will be described. Again, the purpose of this circuit is to determine the time between consecutive edges. The circuit 210 comprises a clock tree circuit 212, a bank of rising edge-triggered flip-flops 222(1) to 222(N) and a bank of falling edge-triggered flip-flops 224(1) to 224(N), a pair of priority encoders 230 and 232, a register 240 and a multiplexer 242. The clock tree circuit 212 comprises a plurality of delay circuit branches 214(1) to 214(N). Each delay circuit branch 214(1) to 214(N) comprises delay circuits 216 and 218 (connected in series), each providing a specific signal delay determined at design and set at circuit implementation. The delay branches 214(1) to 214(N) provide clock inputs to corresponding flip-flops 222(1) to 222(N) and 224(1) to 224(N). Specifically, the delay circuit branch 214(1) outputs a clock input to rising edge flip-flop 222(1) and to falling edge flip-flop 224(1), the delay circuit branch 214(2) outputs a clock input to rising edge-triggered flip-flop 222(2) and to falling edge-triggered flip-flop 224(2), and so on.

The clock inputs to each bank of flip-flops 222(1) to 222(N) and 224(1) to 224(N) are driven by the delayed previous edge, buffered by the buffer 225. The bank of rising edge triggered flip-flops 222(1) to 222(N) is used by the priority encoders 230 and 232 to count how many 1's occur before a 0 thus representing the time from the previous rising edge to the next falling edge. Conversely, the bank of falling edge-triggered flip-flops 224(1) to 224(N) is used to count how many 0's occur before a 1, thus representing the time from the previous falling edge to the next rising edge. The clock tree circuit 212 may be hand-laid out with progressive skew across each bank of flops. The delays of the delay branches 214(1) to 214(N) span a delay range, where for example, delay branch 214(1) has the smallest delay and delay branch 214(N) has the largest delay. For example, the clock edges would be staggered with an adjacent spacing of, for example, no more than $\delta/3$, or in general significantly less than $\delta$. The purpose of the multiple branches of the clock tree circuit 212 and the corresponding rising edge-triggered flip-flops and falling edge-triggered flip flops that the delay branches drive is to locate a rising or falling edge over N delay steps.

As an example shown in FIG. 6, there are 31 flip-flops in each bank (e.g., N=31). The D-inputs of all of the flip-flops are driven by the (buffered) signal from the analog receiver 205. While standard library D-type flip-flops may be suitable for this function, custom D-type flip-flops may be designed to (a) use a differential D-input and differential clock input, (b) have minimal D vs. clock setup plus hold window, and (c) rapidly resolve metastable states.

The priority encoder 230 counts how many 1's occur before a 0 in the bank of rising edge-triggered flip-flops 222(1) to 222(N), and the priority encoder 232 counts how many 0's occur before a 1 in the bank of falling edge-triggered flip-flops 224(1) to 224(N). A single priority encoder may be used to perform the function of priority encoders 230 and 232. The priority encoder 230 encodes a first binary number (e.g., a 5 bit value) that represents the time period from a previous 1-to-0 transition (falling edge) to the next 0-to-1 transition (rising edge) and the priority encoder 232 encodes a second binary number (e.g., a 5 bit value) that represents the time period from the previous 0-to-1 transition (rising edge) to the next 1-to-0 transition (falling edge).

The outputs of the priority encoders 230 and 232 are coupled to the register 240. The multiplexer 242 selects from the register 240 for output as the edge delta value either the first binary number representing the time interval to the next rising edge, or the second binary number representing the time interval to the next falling edge. The MUX 242 alternately selects the first and second binary numbers to produce a stream of binary numbers representing inter-edge spacings of the received waveform. The edge delta digital value is a representation of the time between edges relative to the process, temperature and voltage conditions of the integrated circuit on which the circuit 210 is implemented.

Referring back to FIG. 5, the timestamp calibrator circuit 260 receives as input the digital edge delta value output by the edge-to-edge timestamp circuit 210 and a calibration value that is a measure of the process, voltage and temperature (PVT) conditions of the integrated circuit on which the other circuitry, particularly, the edge-to-edge timestamp block 210, in the receiver 200 are implemented. For example, all of the circuits shown in FIG. 5 for the transmitter 200 may be implemented on the same integrated circuit. Furthermore, additional circuits that may also be present on the same integrated circuit are a ring oscillator circuit 250 and a comparator circuit 255. The ring oscillator circuit 250 is a component of an arbitrary waveform generator, referred to above. In the case where the SerDes link is bi-directional, then both ends of the link will have a transmitter and a receiver of the type shown in FIG. 5 on the same integrated circuit. Consequently, the ring oscillator circuit 250 may be present and reside on the same integrated circuit as the edge-to-edge timestamp circuit 210.

The ring oscillator circuit 250 is described as part of the arbitrary frequency synthesizer and is the component that generates the edge transitions from which one or more clock signals may be generated at an arbitrary desired frequency. The ring oscillator circuit 250 provides the short-term-stable time reference for the frequency synthesizing process. A tap spacing on the ring oscillator circuit 250 ranges from roughly 50 to 200 picoseconds depending on design and process/voltage/temperature (PVT) conditions of the integrated circuit chip in which the ring oscillator is implemented. The average speed of the oscillator circuit is a measure of the instantaneous PVT conditions of the chip. The comparator circuit 255 compares the speed of the ring oscillator circuit 250 with the reference clock (also used in the arbitrary waveform synthesizer) and generates a digital tracking value that is a measure of the instantaneous process, voltage and temperature conditions of the integrated circuit in which the related circuitry is implemented.

The timestamp calibrator circuit 260 performs a division of the digital tracking value into the digital edge delta value from the circuit 210 to produce a measure of the absolute time between edges. This absolute time between edges identifies which edge position has been selected, i.e., the value of n as shown in FIGS. 3 and 4. That is, the timestamp calibrator circuit 210 outputs an indication of which of the "n" edges (transitions) was selected on the transmit side for each inter-edge spacing.

The edge position interpreter 270 takes the value of n output by the timestamp calibrator circuit 210 and using the coding table, such as Table 2, determines the bits associated with that value of n from one of the two columns, depending on whether the value of n represents an interval from a previously detected rising edge or from a previously detected falling edge. For example, if n=7, and at the current point in the received waveform it represents the time interval from a previously detected rising edge, then the edge position interpreter 270 outputs "10111". The RLL decoder 280 decodes the bits output by the edge position interpreter 270 to undo the RLL encoding scheme performed in the transmitter. Finally, an error detection/correction decoder 290 executes an error detection/correction decoding algorithm to output the recovered bits.

The coding scheme implemented by the edge position translator 130 guarantees that smallest and largest possible spacing between consecutive edges each regularly occurs. This feature allows for a further simple adaptive digital calculation by the timestamp calibrator 260 to continuously calibrate the flip-flop banks for PVT conditions to achieve a highly sensitive discrimination. In some cases, the timestamp calibrator 260 is optional, and when not used, the average loop speed derived by the comparator 255 is used to calibrate the banks of flip-flops.

Since both ends of the link (source and destination) are designed to operate according to a value of $\delta$, then the destination can use this knowledge (of $\delta$) to know when an edge should occur. Once an edge is detected, the timestamp calibrator in the receiver may estimate the time error associated with a detected edge by comparing a measured time of occurrence of the detected edge with an expected time (from a set of possible expected times) for the edge. Thus, the estimated time-error for one or more previously detected edges may be used for detecting the next edge, and so forth.

Figure 7:
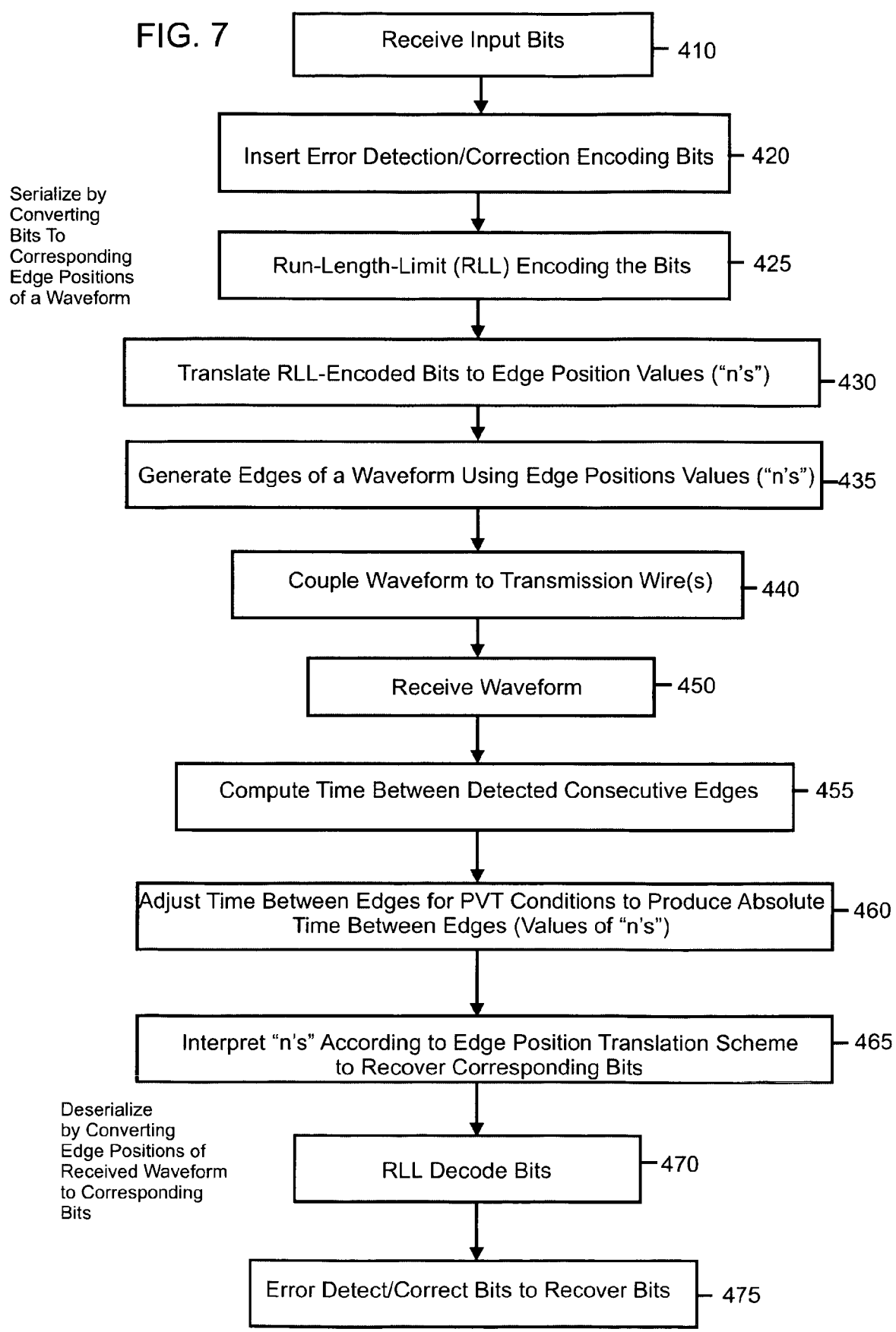
FIG. 7 is a flow chart depicting the steps of the SerDes techniques described herein.

Turning to FIG. 7, the enhanced SerDes technique is shown by a flow chart, where steps 410 through 440 are the transmission or serializer steps performed at a source and steps 450 through 475 are the reception or deserializer steps performed at a destination. In step 410, bits to be transferred are received and in step 420 error detection/correction bits are encoded into the input bits to be transferred. In step 425, the bits are further RLL-encoded. In step 430, the RLL-encoded bits are further encoded (using the edge position translation scheme described above) to select edge spacing values ("n's"). Next, in step 435, the stream of binary edge spacing values ("n's") between successive edges of a waveform are used to generate edges of a waveform. The waveform is coupled to at least one transmission wire (a single-ended wire or differential wires) in step 440 for transmission to the destination.

In step 450, the waveform is received at the destination and the edges of the waveform are detected. In step 455, the time interval between consecutive edges is computed. In step 460, the time interval computed in step 455 is adjusted for PVT conditions to produce a "absolute" time between edges, which corresponds to edge spacing values, i.e., "n's". In step 465, the stream of "n" values produced in step 460 are decoded or interpreted according to the edge position translation scheme described above to recover corresponding RLL-encoded bits. Finally, these bits are RLL-decoded in step 470 and error detected/corrected in step 475 to ultimately recover the original bits.

Figure 8:
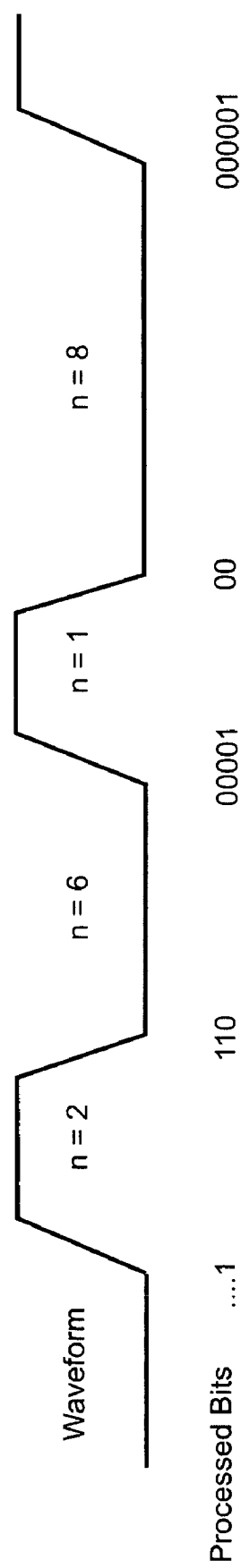
FIG. 8 is a diagram showing the relationship of inter-edge spacings of a waveform and corresponding bit patterns.

FIG. 8 shows an example bi-valued waveform having inter-edge spacings depending on the value of n. This figure shows the corresponding bit patterns for different inter-edge spacings, i.e., different patterns of n, according to Table 2. These bit patterns are "processed bits" that contain error correction codes and run-length limiting codes. For simplicity, T is not shown in FIG. 8, but it should be understood that the actual values of the inter-edge spaces are computed using the values of n in the equation (1), as shown in Table 2.

The Effect of Noise

The preceding description assumes the receiver 200 can reliably discriminate among edges separated by $\delta T$ seconds. Jitter at the source, noise in transmission, and error in detection combine to limit the accuracy of discrimination at the receiver. The RMS net time error from these sources is assumed to be less than $\delta$ for the calculation.

In practice SerDes systems require very low Bit Error Rates (BER) that would necessitate impractical, near-perfect discrimination. Conventional SerDes systems employ fairly good, but imperfect, discrimination with error-correcting coding superimposed on the process. If represented by an eye-diagram, a small percentage of the bits do not fall within it due to noise. The same error correcting coding technique is used in the enhanced SerDes system described herein, but with different parameters.

Error detection/correction coding extracts an overhead. This overhead subtracts from the Shannon limit and introduces some latency. An interesting advantage of the enhanced SerDes technique is that the error-correction tradeoff can be easily altered, perhaps even dynamically, by adjusting the value of $\delta$ without shifting to different frequencies or altering the analog driver or transmission line. Conventional SerDes can only adjust the tradeoff by going to a higher or lower carrier frequency (which closes or opens, respectively, their eye diagrams), creating various problems not the least of which is electromagnetic interference (EMI). In a low-noise environment, the enhanced technique could, for instance, operate at significantly higher data rates without increasing bandwidth, simply by lowering $\delta$.

An Alternative Approach to Noise

The preceding description assumes that a digital data transmission format is used. Edges are transmitted at discrete possible locations in time and the receiver endeavors to discriminate one from another.

Because the enhanced SerDes techniques described herein involve time-modulation, there is another option not available to conventional SerDes techniques. Instead of making $\delta$ larger than the RMS noise, it may be made smaller than the RMS noise so that the possible edge locations are effectively continuous. That changes the problem from one of digital discrimination to a signal-in-noise problem and increases the Shannon Limit that in turn increases the amount of data that can be transmitted. Effectively, quantization noise is removed from the signal source. A table very similar to Table 1 above will apply, but the $\delta$ column essentially becomes the RMS noise. As Shannon's theory proves, data transmission rates are possible arbitrarily close to the limit, and with arbitrarily low error rates if sufficient computation and latency are tolerated.

This would appear to make the system analog, which is partially true. The 'analog' variable is time, not the usual current or voltage. The signals are still binary (meaning two-valued in voltage). Therefore, all circuitry and signal processing are still digital and use conventional, less expensive, all-digital CMOS integrated circuits. Binary numbers represent "analog" time intervals.

Consequently, analog techniques may be used to generate edges at arbitrary times to achieve the desired benefits of the enhanced SerDes techniques described above in connection with equations (1) and (2). If the source data is digital, as in the SerDes case, it is first converted from digital to analog using a conventional digital-to-analog converter and then from analog voltage to time. A typical voltage-to-time converter may consist of a comparator. One of the comparator's inputs is the input voltage that is to be converted to an edge at a desired time. The other input is an internally generated voltage ramp. Voltage ramps are easily made by driving a constant current into a capacitor. When the ramp voltage reaches the input voltage, the comparator flips, producing an output edge at an instant of time proportional to the input signal. Thus, this analog circuit arrangement is another form of an edge position generator that converts the plurality of bits to analog voltages and converts the analog voltages to corresponding edge positions in a waveform, thereby generating the desired edges in the waveform. Often two or more such circuits are ping-ponged because a single ramp must recycle after reaching its maximum, leaving an unusable dead time.

The foregoing description is intended by way of example only and not intended to limit the present invention in any way.

What is claimed is:

1. A method for serial transfer of bits, comprising:
   a. receiving a plurality of bits in parallel to be transferred serially over a channel from a source to a destination; and
   b. converting the plurality of bits to a plurality of edges of a waveform in order to position edges such that more than k inter-edge spacings are possible over a range of spacings between T and kT, where k is a real number greater than 1 and T is the minimum spacing between consecutive edges, and such that a data rate R of the channel in bits per minimum spacing T is greater than 1 wherein the waveform is coupled to the channel.

2. The method of claim 1, wherein converting comprises selecting a probability distribution of possible edges that results in the Shannon information limit for data transfer.

3. The method of claim 1, wherein converting comprises spacing consecutive edges by a time interval $\Delta t=T(1+n\delta)$, where $\delta$ is a granularity of possible edge positions and n is an edge index that is an integer from 0 to some maximum.

4. The method of claim 3, wherein spacing comprises selecting an edge position for all possible edges n so that the Shannon information per unit time of the channel is equal among all edges n.

5. The method of claim 3, wherein spacing comprises selecting a value of $\delta$ that is a fraction less than 1.

6. The method of claim 3, wherein spacing comprises selecting a value for $\delta$ that is the reciprocal of an integer greater than 1.

7. The method of claim 6, wherein converting comprises selecting a value for $\delta$ depending on a desired data rate R, given by the equation $\log_2[1-2^{-R\delta}]=-R$.

8. The method of claim 3, and further comprising encoding the plurality of bits using an error correction redundancy code prior to converting the plurality of bits to edges.

9. The method of claim 8, wherein spacing comprises changing the value for $\delta$ to alter the degree of error correction encoding.

10. The method of claim 3, wherein changing comprises increasing or reducing the value for $\delta$ according to noise conditions of the channel.

11. The method of claim 9, wherein changing comprises increasing or reducing the value for $\delta$ according to noise conditions of the channel.

12. The method of claim 11, wherein changing comprises reducing the value for $\delta$ to transfer bits at a higher rate when noise conditions of the channel permit.

13. The method of claim 3, wherein spacing comprises selecting a value for $\delta$ that is sufficiently small so that possible edge positions are effectively continuous.

14. The method of claim 13, wherein selecting comprises selecting a value for $\delta$ that is smaller than the root mean squared (RMS) noise of the channel.

15. The method of claim 1, wherein converting comprises selecting positions for the edges such that the probability of using a given edge position can be approximately arbitrarily specified between 0 and 1.

16. The method of claim 1, wherein converting comprises mapping patterns in the plurality of bits to edge positions in the waveform according to the following code:

| Following a (1) | Value of n | Rising Edge to Falling Edge Spacing |
|---|---|---|
| 1 $1^m$ 0 | 2m | $T(1 + 2m\delta)$ |
| 0 $1^m$ 0 | 2m + 1 | $T(1 + (2m + 1)\delta)$ |
| Following a (0) | Value of n | Falling Edge to Rising Edge Spacing |
| 0 $0^m$ 1 | 2m | $T(1 + 2m\delta)$ |
| 1 $0^m$ 1 | 2m + 1 | $T(1 + (2m + 1)\delta)$ | where $1^m$ means m one's in a row, $0^m$ means m zero's in a row, m is zero or any positive integer, $\delta$ is a granularity of possible edge positions and n is an edge index that is an integer from 0 to some maximum.

17. The method of claim 16, wherein converting is performed according to the code but with the specified "rising edge to falling edge spacing" serving as the "falling edge to rising edge spacing" and the specified "falling edge to rising edge spacing" serving as the "rising edge to falling edge spacing".

18. The method of claim 16, wherein converting is performed according to the code but with the first bit in first column complemented in one or both pairs of rows.

19. The method of claim 16, wherein converting comprises encoding the plurality of bits to transfer data at an average data rate of $R=6/(2+5\delta)$.

20. The method of claim 1, and further comprising encoding the plurality of bits using a run-length limiting code prior to converting.

21. The method of claim 20, wherein encoding comprises encoding the plurality of bits using a run-length limiting code that also limits the degree to which transmitted data can get ahead of or behind the plurality of bits at the source.

22. The method of claim 1, and further comprising encoding the plurality of bits using a code that limits the degree to which transmitted data can get ahead of or behind the source digital data.

23. The method of claim 1, wherein converting comprises mapping patterns in the plurality of bits to a stream of binary numbers representing spacings between the consecutive edges of the waveform.

24. The method of claim 23, and further comprising generating positions for the edges with respect to a reference clock using a digital circuit that is capable of generating arbitrary positions for edges based on the stream of binary numbers.

25. The method of claim 1, wherein converting comprises mapping patterns in the plurality of bits to edge spacings so as to ensure that the smallest and largest possible spacing between consecutive edges each regularly occurs.

26. The method of claim 1, wherein converting comprises converting the plurality of bits to analog voltages and converting the analog voltages to corresponding edge positions, thereby generating the desired edges in the waveform.

27. The method of claim 1, and further comprising coupling the waveform to at least one transmission wire for transmission to the destination.

28. The method of claim 27, and further comprising detecting edges at the destination.

29. The method of claim 28, and further comprising digitally computing a calibration value for circuitry at the destination that recovers the bits, wherein the calibration value is a measure of process, temperature and voltage conditions of the circuitry.

30. The method of claim 27, and further comprising deriving a stream of numbers representing the time intervals between detected consecutive edges, and translating the stream of numbers according to an edge position translation scheme to recover corresponding bits.

31. The method of claim 27, and further comprising detecting edges at the destination, and estimating the time error associated with a detected edge by comparing a measured time for the detected edge with an expected time.

32. The method of claim 31, wherein detecting comprises detecting a next edge based on the estimated time error for one or more previous detected edges.

33. The method of claim 1, wherein converting comprises converting the plurality of bits to a plurality edges such that the data rate R of the channel in bits per minimum spacing T is greater than 1.5.

34. A serializer device for transfer of bits, comprising:
  a. a run-length limit (RLL) encoder that encodes a plurality of bits to be serially transferred, to produce RLL-encoded bits;
  b. a edge position translator coupled to the run-length limit encoder that converts the RLL-encoded bits to a stream of binary numbers representing desired spacings between consecutive edges of a waveform in order to position edges such that more than k inter-edge spacings are possible over a range of spacings between T and kT, where k is a real number greater than 1 and T is the minimum spacing between consecutive edges; and
  c. an edge position generator circuit coupled to the edge position translator that generates positions of edges based on the stream of binary numbers output by the edge position translator.

35. The serializer device of claim 34, wherein the edge position translator converts the plurality of bits to a plurality of edges by selecting a probability distribution of possible edges that results in the Shannon information limit for data transfer.

36. The serializer device of claim 34, wherein the edge position translator generates inter-edge spacings, $\Delta t = T(1+n\delta)$, where $\delta$ is a granularity of possible edge positions and n is an edge index that is an integer from 0 to some maximum.

37. The serializer device of claim 36, and further comprising an error redundancy encoder having an output connected to the run-length limit encoder, wherein the error redundancy encoder encodes the plurality of bits according to an error correction/detection code prior to processing by the run-length limit encoder.

38. The serializer device of claim 37, wherein edge position translator changes the value for $\delta$ to alter the degree of error correction encoding.

39. The serializer device of claim 37, wherein the edge position translator increases or decreases the value for $\delta$ according to noise conditions of the channel over which the waveform is transmitted.

40. The serializer device of claim 36, wherein the edge position translator maps patterns in the plurality of bits to edge positions in the waveform according to the following code:

| Following a (1) | Value of n | Rising Edge to Falling Edge Spacing |
|---|---|---|
| 1 1$^m$ 0 | 2m | $T(1 + 2m\delta)$ |
| 0 1$^m$ 0 | 2m + 1 | $T(1 + (2m + 1)\delta)$ |

| Following a (0) | Value of n | Falling Edge to Rising Edge Spacing |
|---|---|---|
| 0 0$^m$ 1 | 2m | $T(1 + 2m\delta)$ |
| 1 0$^m$ 1 | 2m + 1 | $T(1 + (2m + 1)\delta)$ | where 1$^m$ means m one's in a row, 0$^m$ means m zero's in a row, m is zero or any positive integer, $\delta$ is a granularity of possible edge positions and n is an edge index that is an integer from 0 to some maximum.

41. The serializer device of claim 34, wherein the edge position translator converts the RLL-encoded bits to the stream of binary numbers such that a data rate R of the waveform on a channel in bits per minimum spacing T is greater than 1.5.

42. A method for recovering bits at a destination that are serially transferred from a source, comprising:
  a. receiving a binary waveform comprising a plurality of edges from the source;
  b. detecting the edges in the waveform and deriving a stream of numbers representing the time intervals between detected consecutive edges; and
  c. converting the stream of numbers to corresponding bits according to an edge position translation scheme.

43. The method of claim 42, and further comprising decoding the bits according to a run-length limiting coding scheme.

44. The method of claim 42, and further comprising estimating the time error associated with a detected edge by comparing a measured time for the detected edge with an expected time.

45. The method of claim 44, wherein detecting comprises detecting a next edge based on the estimated time error for one or more previous detected edges.

46. The method of claim 42, wherein converting comprises converting the stream of numbers to corresponding bits according to the edge position translation scheme that maps patterns of bits to binary numbers representing desired spacings between consecutive edges of the waveform that position edges such that more than k inter-edge spacings are possible over a range of spacings between T and kT, where k is a real number greater than 1 and T is the minimum spacing between consecutive edges.

47. A deserializer device for recovering bits at a destination that have been serially transferred from a source, comprising:
  a. an edge-to-edge timestamp circuit that determines a time interval between successive edges of a received waveform and producing a stream of binary numbers representing inter-edge spacings of the waveform;
  b. an edge position interpreter coupled to the edge-to-edge time stamp circuit that converts the stream of binary numbers to run-length encoded bits according to an edge position translation scheme; and
  c. a run-length limit decoder coupled to the edge position interpreter that run-length-limit decodes the run-length encoded bits output by the edge position interpreter to recover the bits.

48. The deserializer of claim 47, and further comprising an error correction/detection decoder coupled to the run-length limit decoder that error detects and corrects the bits output by the run-length limit decoder.

49. The deserializer of claim 47, and further comprising a timestamp calibrator circuit coupled to the edge-to-edge timestamp circuit that computes a corrected stream of binary numbers based on a measure of the process, temperature and voltage conditions of the integrated circuit on which the edge-to-edge timestamp circuit is implemented.

50. The deserializer of claim 49, wherein the timestamp calibrator circuit further estimates a time error associated with a detected edge by comparing a measured time for the detected edge with an expected time, and wherein the edge-to-edge timestamp circuit computes the time interval with respect to subsequent edges based on the estimated time error for one or more previous detected edges.

51. The deserializer of claim 47, wherein the edge position interpreter converts the stream of binary numbers to corresponding bits according to the edge position translation scheme that maps patterns of bits to binary numbers representing desired spacings between consecutive edges of the waveform that position edges such that more than k inter-edge spacings are possible over a range of spacings between T and kT, where k is a real number greater than 1 and T is the minimum spacing between consecutive edges.

52. The deserializer of claim 47, wherein the edge-to-edge timestamp circuit comprises a bank of rising edge-triggered flip-flops dedicated to capturing a falling edge in the waveform; a bank of falling edge-triggered flip-flops dedicated to capturing a rising edge in the waveform; a clock tree circuit that outputs a plurality of clock signals having edges that are progressively skewed from a smallest delay to a largest delay and which are coupled to clock inputs of corresponding flip-flops in the banks of flip-flops, the D-inputs of the rising edge-triggered flip-flops and the D-inputs of the falling edge-triggered flip-flops being coupled to the waveform, at least one priority encoder coupled to each of the banks of flip-flops to determine the number of 1's that occur before a 0 in the bank of rising edge-triggered flip-flops and to determine the number of 0's that occur before a 1 in the bank of falling edge-triggered flip-flops, a register that stores a first binary number output by the priority encoder representing a time interval from a previous falling edge to the next rising edge and a second binary number representing a time interval from a previous rising edge to the next falling edge and a multiplexer coupled to the register that alternately selects for output the first binary number and the second binary number to form the stream of binary numbers representing inter-edge spacings of the waveform.

53. The deserializer of claim 52, wherein each of the rising edge-triggered and falling edge-triggered flip-flops have at least one of a differential D-input and a differential clock input.

54. The deserializer of claim 52, wherein each of the flip-flops in the first and second banks are D-type flip-flops that have a minimal D vs. clock setup plus hold window.

55. The deserializer of claim 52, wherein each of the flip-flops in the first and second banks can rapidly resolve metastable states.

56. The deserializer of claim 52, wherein the clock tree circuit produces the plurality of clock signals such that edges of adjacent clock signals are spaced significantly closer than a granularity of inter-edge spacings of the received waveform.

57. A serializer-deserializer system for serial transfer of bits, comprising:
  a. a serializer comprising:
    i. a run-length limit (RLL) encoder that encodes a plurality of bits to be serially transferred to produce RLL-encoded bits;
    ii. an edge position translator coupled to the run-length limit encoder that converts the RLL-encoded bits to a stream of binary numbers representing desired spacings between consecutive edges of a waveform representing the plurality of bits in order to position edges such that more than k inter-edge spacings are possible over a range of spacings between T and kT, where k is a real number greater than 1 and T is the minimum spacing between consecutive edges; and
    iii. an edge position generator circuit coupled to the edge position translator that generates positions of edges based on the stream of binary numbers output by the edge position translator;
  b. a deserializer comprising:
    i. an edge-to-edge timestamp circuit that determines time intervals between successive edges of a received waveform and producing a stream of binary numbers representing inter-edge spacings of the waveform;
    ii. an edge position interpreter coupled to the edge-to-edge time stamp circuit that converts the stream of binary numbers to RLL-encoded bits according to an edge position translation scheme; and
    iii. a run-length limit decoder coupled to the edge position interpreter that run-length-limit decodes the RLL-encoded bits output by the edge position interpreter to recover the bits.

58. The serializer-deserializer system of claim 57, wherein the edge position translator of the serializer converts the RLL-encoded bits to the stream of binary numbers such that a data rate R of the waveform on a channel in bits per minimum spacing T is greater than 1.5.

59. A method for serial transfer of bits, comprising:
  a. receiving a plurality of bits to be transferred over a channel from a source to a destination; and
  b. converting the plurality of bits to a plurality of edges of a waveform in order to position edges such that more than k inter-edge spacings are possible over a range of spacings between T and kT, where k is a real number greater than 1 and T is the minimum spacing between consecutive edges, and wherein converting comprises spacing consecutive edges by a time interval $\Delta t = T(1+n\delta)$, where $\delta$ is a granularity of possible edge positions and n is an edge index that is an integer from 0 to some maximum.

60. The method of claim 59, wherein spacing comprises selecting an edge position for all possible edges n so that the Shannon information per unit time of the channel is equal among all edges n.

61. The method of claim 59, wherein spacing comprises selecting a value of $\delta$ that is a fraction less than 1.

62. The method of claim 59, wherein spacing comprises selecting a value for $\delta$ that is a reciprocal of an integer greater than 1.

63. The method of claim 62, wherein converting comprises selecting a value for $\delta$ depending on a desired data rate R, given by the equation $\log^2[1-2^{-R\delta}] = -R$.

64. The method of claim 59, and further comprising encoding the plurality of bits using an error correction redundancy code prior to converting the plurality of bits to edges.

65. The method of claim 64, wherein spacing comprises changing the value for $\delta$ to alter the degree of error correction encoding.

66. The method of claim 59, wherein spacing comprises changing the value for $\delta$ according to noise conditions of the channel.

67. The method of claim 66, wherein changing comprises increasing or reducing the value for $\delta$ according to noise conditions of the channel.

68. The method of claim 67, wherein changing comprises reducing the value for $\delta$ to transfer bits at a higher rate when noise conditions of the channel permit.

69. The method of claim 59, wherein spacing comprises selecting a value for $\delta$ that is sufficiently small so that possible edge positions are effectively continuous.

70. The method of claim 69, wherein selecting comprises selecting a value for a that is smaller than the root mean squared (RMS) noise of the channel.

71. The method of claim 59, wherein converting comprises selecting positions for the edges such that the probability of using a given edge position can be approximately arbitrarily specified between 0 and 1.

72. The method of claim 59, wherein converting comprises mapping patterns in the plurality of bits to edge positions in the waveform according to the following code:

| Following a (1) | Value of n | Rising Edge to Falling Edge Spacing |
|---|---|---|
| 1 1$^m$ 0 | 2 m | T(1 + 2 mδ) |
| 0 1$^m$ 0 | 2 m + 1 | T(1 + (2 m + 1)δ) |

| Following a (0) | Value of n | Falling Edge to Rising Edge Spacing |
|---|---|---|
| 0 0$^m$ 1 | 2 m | T(1 + 2 mδ) |
| 1 0$^m$ 1 | 2 m + 1 | T(1 + (2 m + 1)δ) | where 1$^m$ means m one's in a row, 0$^m$ means m zero s in a row, m is zero or any positive integer, δ is a granularity of possible edge positions and n is an edge index that is an integer from 0 to some maximum.

73. The method of claim 72, wherein converting is performed according to the code but with the specified "rising edge to falling edge spacing" serving as the "falling edge to rising edge spacing" and the specified "falling edge to rising edge spacing" serving as the "rising edge to falling edge spacing".

74. The method of claim 72, wherein converting is performed according to the code but with the first bit in the first column complemented in one or both pairs of rows.

75. The method of claim 59, wherein converting comprises encoding the plurality of bits to transfer data at an average data rate of R=6/(2+5δ).

76. The method of claim 59, and further comprising encoding the plurality of bits using a run-length limiting code prior to converting, wherein encoding comprises encoding the plurality of bits using a run-length limiting code that also limits the degree to which transmitted data can get ahead of or behind the plurality of bits at the source.

77. The method of claim 59, and further comprising encoding the plurality of bits using a code that limits the degree to which transmitted data can get ahead of or behind the plurality of bits at the source.

78. The method of claim 59, wherein converting comprises mapping patterns in the plurality of bits to a stream of binary numbers representing spacings between the consecutive edges of the waveform.

79. The method of claim 78, and further comprising generating positions for the edges with respect to a reference clock using a digital circuit that is capable of generating arbitrary positions for edges based on the stream of binary numbers.

80. The method of claim 59, wherein converting comprises mapping patterns in the plurality of bits to edge spacings so as to ensure that the smallest and largest possible spacing between consecutive edges each regularly occurs.

81. The method of claim 59, wherein converting comprises converting the plurality of bits to analog voltages and converting the analog voltages to corresponding edge positions, thereby generating the edges in the waveform.

82. The method of claim 59, and further comprising detecting edges at the destination.

83. The method of claim 82, and further comprising digitally computing a calibration value for circuitry at the destination that recovers the bits, wherein the calibration value is a measure of process, temperature and voltage conditions of the circuitry.

84. The method of claim 82, and further comprising deriving a stream of numbers representing the time intervals between detected consecutive edges, and translating the stream of numbers according to an edge position translation scheme to recover corresponding bits.

85. The method of claim 82, and further comprising detecting edges at the destination, and estimating the time error associated with a detected edge by comparing a measured time for the detected edge with an expected time.

86. The method of claim 85, wherein detecting comprises detecting a next edge based on the estimated time error for one or more previous detected edges.

87. The method of claim 59, wherein converting comprises converting the plurality of bits to a plurality edges such that the data rate R of the channel in bits per minimum spacing T is greater than 1.5.

88. The method of claim 59, wherein receiving comprises receiving the plurality of bits in parallel to be transferred serially over the channel by coupling the waveform to the channel.

* * * * *